United States Patent
Go et al.

(10) Patent No.: US 9,754,804 B2
(45) Date of Patent: Sep. 5, 2017

(54) METHOD OF MOUNTING ELECTRONIC DEVICE AND UNDER-FILL FILM USED THERETO

(71) Applicant: SAMSUNG DISPLAY CO., LTD., Yongin-si, Gyeonggi-do (KR)

(72) Inventors: Jeong Hun Go, Yongin-si (KR); Yeon Sun Na, Yongin-si (KR); Jeong Mo Nam, Yongin-si (KR); Hyun Seok Hong, Yongin-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/164,228

(22) Filed: May 25, 2016

(65) Prior Publication Data

US 2017/0154792 A1  Jun. 1, 2017

(30) Foreign Application Priority Data

Dec. 1, 2015 (KR) .................. 10-2015-0169866

(51) Int. Cl.
*H01L 23/48* (2006.01)
*H01L 23/52* (2006.01)
(Continued)

(52) U.S. Cl.
CPC ............ *H01L 21/54* (2013.01); *H01L 21/486* (2013.01); *H01L 21/4853* (2013.01);
(Continued)

(58) Field of Classification Search
CPC ......... H01L 21/54; H01L 21/52; H01L 23/18; H01L 23/49838; H01L 21/486; H01L 21/4853; H01L 23/49811
See application file for complete search history.

(56) References Cited

U.S. PATENT DOCUMENTS 5,233,222 A * 8/1993 Djennas ............... H01L 21/565
                                                   257/666
7,265,994 B2  9/2007 Danvir et al.
(Continued)

FOREIGN PATENT DOCUMENTS

KR   10-2009-0015357 A   2/2009
KR     10-1054239 B1    8/2011
(Continued)

*Primary Examiner* — Victor A Mandala
(74) *Attorney, Agent, or Firm* — Innovation Counsel LLP

(57) ABSTRACT

A method of mounting an electronic device includes: preparing a printed circuit board including a base substrate, connection pads disposed on the base substrate and spaced apart from each other, and a solder resist including contact holes exposing a portion of the connection pads; disposing preliminary bumps on the exposed portion of the connection pads via the contact holes; disposing under-fill patterns in areas between the preliminary bumps on the solder resist; disposing an electronic device on the preliminary bumps and the under-fill patterns; and mounting the electronic device onto the printed circuit board by reflowing the preliminary bumps and the under-fill patterns. The disposing of the under-fill patterns may include: providing an under-fill film including a base film having openings spaced apart from each other, and the under-fill patterns disposed within the openings; applying pressure to the under-fill film; and removing the base film from the under-fill film.

5 Claims, 5 Drawing Sheets

(51) Int. Cl.
  *H01L 29/40*    (2006.01)
  *H01L 21/54*    (2006.01)
  *H01L 21/48*    (2006.01)
  *H01L 21/52*    (2006.01)
  *H01L 23/18*    (2006.01)
  *H01L 23/498*   (2006.01)

(52) U.S. Cl.
  CPC .............. *H01L 21/52* (2013.01); *H01L 23/18* (2013.01); *H01L 23/49811* (2013.01); *H01L 23/49838* (2013.01)

(56) References Cited

U.S. PATENT DOCUMENTS

| | | | |
|---|---|---|---|
| 2002/0146861 A1* | 10/2002 | Standing | H01L 21/563 438/108 |
| 2004/0095501 A1* | 5/2004 | Aizawa | H01L 27/14618 348/340 |
| 2015/0072479 A1 | 3/2015 | Dias et al. | |
| 2015/0162258 A1* | 6/2015 | Hsu | H01L 24/92 257/734 |
| 2015/0255312 A1* | 9/2015 | Brofman | H01L 21/563 257/737 |

FOREIGN PATENT DOCUMENTS

KR  10-1117757 B1   3/2012
KR  10-2014-0031632 A   3/2014

\* cited by examiner

METHOD OF MOUNTING ELECTRONIC DEVICE AND UNDER-FILL FILM USED THERETO

CROSS-REFERENCE TO RELATED APPLICATION

This application claims priority to and the benefit of Korean Patent Application No. 10-2015-0169866, filed on Dec. 1, 2015, in the Korean Intellectual Property Office, the disclosure of which is incorporated herein by reference in its entirety.

BACKGROUND

1. Field

The present disclosure relates to a method of mounting an electronic device and an under-fill film used thereto.

2. Description of the Related Art

Electronic devices, such as an Integrated Circuit (IC) chip, become thin and small, and highly functional. Typically, electronic devices are mounted on a printed circuit board, and a density of electronic devices mounted on a printed circuit board gradually increases. Accordingly, various techniques for mounting an electronic device on a printed circuit board have been developed to integrate more electronic devices on a printed circuit board.

In order to secure coupling reliability of electronic devices and a printed circuit board, a space formed between the electronic device and the printed circuit board may be filled. The space filled between the electronic device and the printed circuit board, herein referred to as an under-fill, increases a coupling force of the electronic device and the printed circuit board.

The under-fill is generally formed by using a liquid resin. If the under-fill is filled with an excessive volume, a part of the under-fill can be discharged to a peripheral area of the electronic device. The discharged under-fill may contaminate a surface of the printed circuit board or an edge of the electronic device.

SUMMARY OF THE INVENTION

The present disclosure has been made in an effort to solve the above-described problems associated with a prior art, and provides a method of mounting an electronic device and preventing an under-fill from being discharged.

The present disclosure has also been made in an effort to solve the above-described problems associated with a prior art, and provides an under-fill film to mount the electronic device.

An exemplary embodiment of the present disclosure provides a method of mounting an electronic device, including: preparing a printed circuit board; disposing preliminary bumps on the connection pads; disposing under-fill patterns in areas between the preliminary bumps on the solder resist; disposing an electronic device on the preliminary bumps and the under-fill patterns; and mounting the electronic device onto the printed circuit board by reflowing the preliminary bumps and the under-fill patterns. The printed circuit board may include a base substrate, a plurality of connection pads disposed on the base substrate and spaced apart from each other, and a solder resist including a plurality of contact holes exposing a portion of each of the plurality of connection pads. The disposing of the under-fill patterns may include: providing an under-fill film including a base film having a plurality of openings spaced apart from each other, and the under-fill patterns disposed within the plurality of openings; applying pressure to the under-fill film; and removing the base film from the under-fill film.

An adhesive force between the under-fill patterns and the solder resist may be larger than an adhesive force between the base film and the solder resist. The adhesive force between the under-fill patterns and the solder resist may be larger than an adhesive force between the base film and the under-fill patterns.

A cross-section of an opening may be parallel to a surface of the base film and have one of a circular shape and a rhombus shape, and each of the under-fill patterns may include: a body part disposed in a center of the opening; and a plurality of connection parts extended from sides of the body part and connected to the base film.

The plurality of connection parts may have a shape with a decreasing width as being extended from the body part to the base film.

The disposing of the preliminary bumps may be performed before the disposing of the under-fill patterns. The disposing of the preliminary bumps may be performed after the disposing of the under-fill patterns.

The base substrate may include an insulating substrate and a circuit pattern disposed on the insulating substrate.

Another exemplary embodiment of the present disclosure provides an under-fill film, including: a base film having a plurality of openings spaced apart from each other; and a plurality of under-fill patterns disposed within the plurality of openings, respectively. Each of the under-fill pattern may include: a body part disposed in a center of an openings; and a plurality of connection parts extended from sides of the body part and connected to the base film.

According to the exemplary embodiment of the present disclosure, the method of mounting the electronic device may prevent the under-fill from being discharged. Accordingly, it is possible to prevent an edge of the electronic device and a surface of a printed circuit board, on which the electronic device is mounted, from being contaminated.

BRIEF DESCRIPTION OF THE DRAWINGS

Example embodiments will now be described more fully hereinafter with reference to the accompanying drawings; however, they may be embodied in different forms and should not be construed as being limited to the embodiments set forth herein. Rather, these embodiments are provided so that the present disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout the present disclosure.

DETAILED DESCRIPTION OF THE INVENTION

Hereinafter, an exemplary embodiment of the present disclosure will be described in detail with reference to the accompanying drawings.

Figure 1:
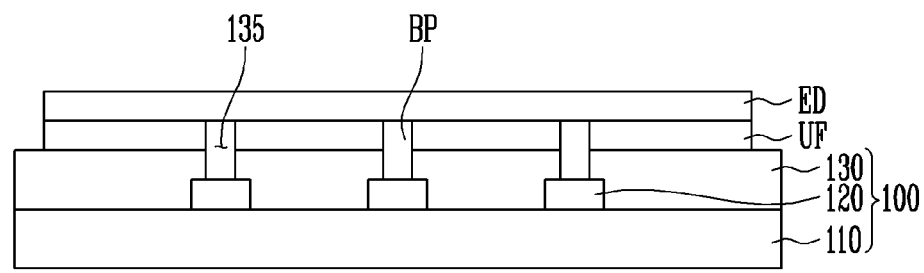
FIG. 1 is a cross-sectional view of a printed circuit board, on which an electronic device is mounted, according to an exemplary embodiment of the present disclosure.

FIG. 1 is a cross-sectional view of a printed circuit board, on which an electronic device is mounted, according to an exemplary embodiment of the present disclosure.

Referring to FIG. 1, the printed circuit board 100 may include a base substrate 110, a plurality of connection pads 120, and a solder resist 130, and an electronic device ED may be mounted on the printed circuit board 100. The electronic device ED may be electrically connected with the connection pads 120 through the plurality of bumps BP. An under-fill UF may be disposed between the electronic device ED and the printed circuit board 100.

The base substrate 110 may include an insulating substrate and a circuit pattern disposed on the insulating pattern. The insulating substrate may be one of a film base substrate including a polymer organic material and a plastic base substrate. For example, the insulating substrate may include polystyrene (PS), polyvinyl alcohol (PVA), polymethyl methacrylate (PMMA), polyethersulfone ((PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), triacetate cellulose (TAC), and cellulose acetate propionate (CAP). Further, the base substrate 110 may also include a fiber glass reinforced plastic (FRP).

The circuit pattern may be disposed on at least one surface of the insulating substrate. The circuit pattern may include a conductive metal.

The connection pads 120 may be connected to the circuit pattern, and spaced apart from each other on the base substrate 110. The connection pads 120 may include a conductive metal. For example, the connection pads 120 may include copper (Cu). The connection pads 120 may be electrically connected to the electronic device ED through the plurality of bumps BP.

The solder resist 130 may be disposed on the base substrate 110. During soldering, in which the electronic device ED is mounted on the printed circuit board 100, the solder resist 130 may prevent the connection pads 120 from being damaged. Further, the solder resist 130 may include contact holes 135 exposing the connection pads 120.

The bumps BP may be disposed on the connection pads 120 that are exposed by the contact holes 135. The bumps BP may be electrically connected with the electronic device ED and the connection pads 120. The bumps BP may be generally formed by disposing a solder paste or a solder ball on the connection pads 120 and then performing a reflow.

The under-fill UF may be disposed between the electronic device ED and the printed circuit board 100. For example, the under-fill UF may be disposed between the electronic device ED and the solder resist 130. The under-fill UF may fix the electronic device ED onto the printed circuit board 100. Further, the under-fill UF may protect the electronic device ED and the printed circuit board 100 by absorbing an external impact.

Hereinafter, a method of mounting the electronic device ED on the printed circuit board 100 will be described.

Figure 6:
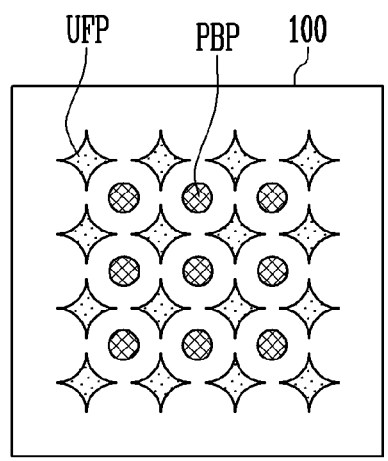
FIG. 6 is a top plan view for describing a disposition of preliminary bumps and under-fill patterns, according to an exemplary embodiment of the present disclosure.
Figure 7:
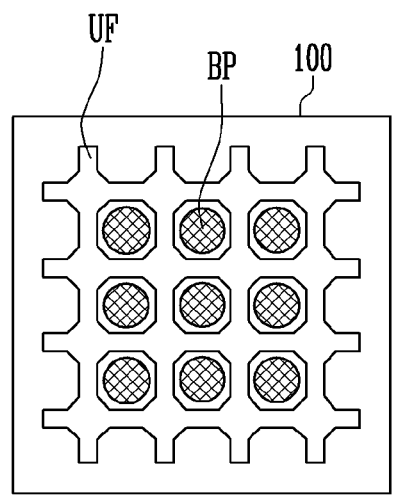
FIG. 7 is a top plan view for describing a disposition of a bump and an under-fill, according to an exemplary embodiment of the present disclosure.
Figure 8:
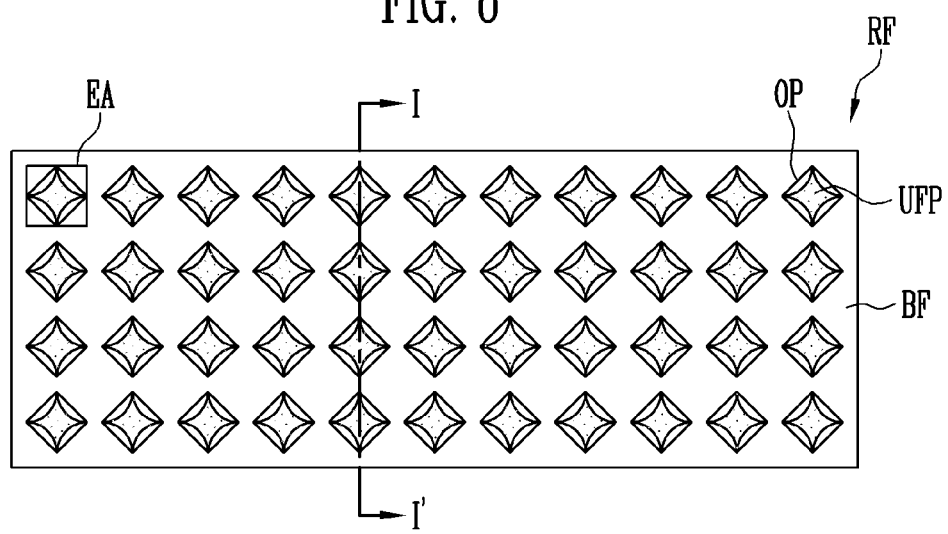
FIG. 8 is a top plan view for describing an under-fill film including under-fill patterns, according to an exemplary embodiment of the present disclosure.
Figure 9:
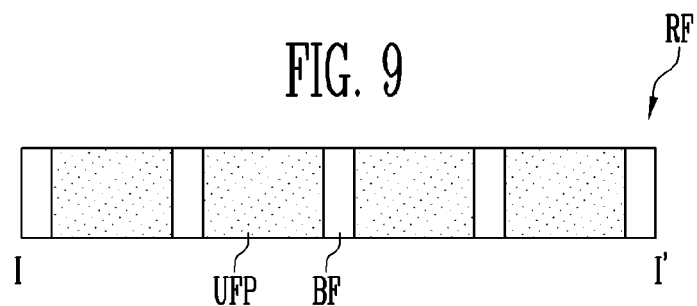
FIG. 9 is a cross-sectional view taken along line I-I' of FIG. 8.

FIGS. 2 to 5 are cross-sectional views for process steps for mounting an electronic device, according to an exemplary embodiment of the present disclosure. FIG. 6 is a top plan view for describing a disposition of preliminary bumps and under-fill patterns, according to an exemplary embodiment of the present disclosure. FIG. 7 is a top plan view for describing a disposition of a bump and an under-fill, according to an exemplary embodiment of the present disclosure. FIG. 8 is a top plan view for describing an under-fill film including under-fill patterns, according to an exemplary embodiment of the present disclosure. FIG. 9 is a cross-sectional view taken along line I-I' of FIG. 8.

Figure 2:
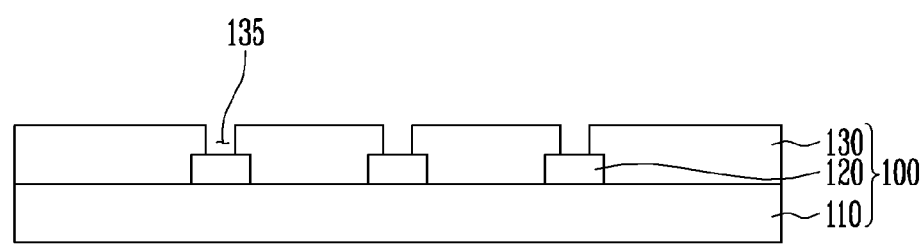
FIGS. 2 to 5 are cross-sectional views for showing process steps for mounting an electronic device, according to an exemplary embodiment of the present disclosure.

Referring to FIG. 2, a printed circuit board 100 is prepared. The printed circuit board 100 may include a base substrate 110, connection pads 120 disposed on the base substrate 110, and a solder resist 130 including contact holes 135 exposing a part of the connection pads 120.

The printed circuit board 100 may be manufactured by a method described below.

First, the base substrate 110 is manufactured. The base substrate 110 may include an insulating substrate and a circuit pattern disposed on the insulating pattern. The circuit pattern may be formed by forming a first conductive layer on the insulating substrate, and then patterning the first conductive layer.

After the base substrate 110 is manufactured, the connection pads 120 are formed on the base substrate 110. The connection pads 120 may be formed by forming a second conductive layer on the base substrate 110 and patterning the second conductive layer. The connection pads 120 may be connected to the circuit pattern of the base substrate 110, and may be spaced apart from each other on the base substrate 110. The connection pads 120 may include a conductive metal, for example, copper (Cu).

It is noted that the present exemplary embodiment describes that the circuit pattern is formed and then the connection pads 120 are formed, however, the present disclosure is not limited thereto. For example, the connection pads 120 may be a part of the circuit pattern included in the base substrate 110, and may also be simultaneously formed with the circuit pattern.

After the connection pads 120 are formed, surfaces of the connection pads 120 and the base substrate 110 are washed. The washing may remove foreign substance, such as a fingerprint, oil, and dust, remaining on the connection pads 120 and the base substrate 110.

Then, a surface treatment process of providing roughness to the surface of the base substrate 110 is performed. The surface processing process may increase an adhesive force between the surface of the base substrate 110 and a material layer formed on the base substrate 110. On an area where the surface treatment process is not perform, an adhesive force between the base substrate 110 and the material layer formed on the base substrate 110 is lower than the adhesive force on an area where the surface treatment process is performed.

After the surface treatment process, the solder resist 130 is formed on the base substrate 110. The solder resist 130 may include a thermosetting resin or a photo-curable resin.

According to one embodiment, the solder resist 130 may be formed by forming a coating layer of a solder resist material on the base substrate 110, and patterning the coating layer. The coating layer may be formed by using a coating method such as a roll coating method and a spin coating method. Further, the solder resist 130 may include the contact holes 135 exposing the connection pads 120 by the patterning.

Further, the solder resist 130 may be formed by a screen printing method. Herein, the contact holes 135 may be simultaneously formed with the solder resist 130.

Figure 3:
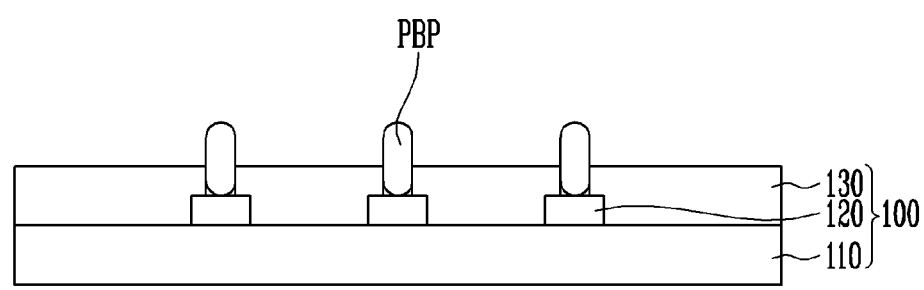

Referring to FIG. 3, after the printed circuit board 100 is prepared, preliminary bumps PBP are formed on the connection pads 120 exposed by the contact holes 135. The preliminary bumps PBP may be formed by filling a solder paste or disposing a solder ball into the contact holes 135.

Figure 4:
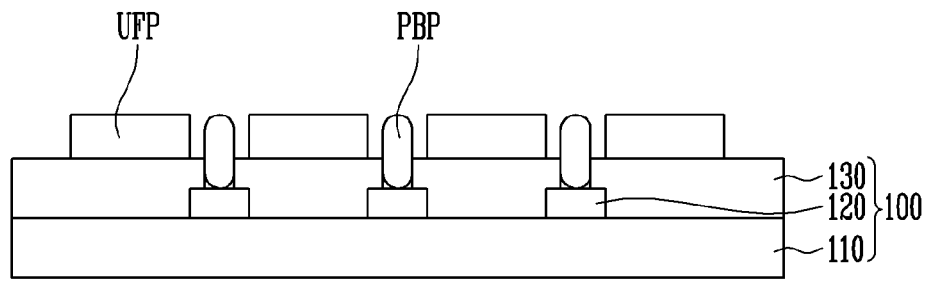

Referring to FIG. 4, after the preliminary bumps PBP are formed, a plurality of under-fill patterns UFP is formed in areas between the preliminary bumps PBP onto the solder resist 130. For example, the preliminary bumps PBP and the under-fill patterns UFP may be disposed as illustrated in FIG. 6. The preliminary bumps PBP may be disposed in a matrix form at lattice points of a lattice. Further, the under-fill patterns UFP may be spaced apart from the adjacent preliminary bumps PBP, and disposed in spaces divided by the lattice.

The under-fill patterns UFP may be formed as described below.

First, an under-fill film RF illustrated in FIGS. 8 and 9 is prepared. The under-fill film RF may include a base film BF having a plurality of openings OP and the under-fill patterns UFP disposed in the openings OP. The under-fill film RF may have a shape of a reel film that is wound around a reel.

Then, the under-fill film RF is supplied onto the printed circuit board 100 by rotating the reel.

When the under-fill film RF is supplied onto the printed circuit board 100, a pressure is applied to the under-fill film RF. When the pressure is applied to the under-fill film RF, the under-fill patterns UFP may be disposed on the solder paste 130 by a difference between an adhesive force between the solder resist 130 and the under-fill patterns UFP and an adhesive force between the solder resist 130 and the base film BF. The adhesive force between the solder resist 130 and the under-fill patterns UFP may be larger than the adhesive force between the solder resist 130 and the base film BF. Further, the adhesive force between the solder resist 130 and the under-fill patterns UFP may be larger than an adhesive force between the base film BF and the under-fill patterns UFP.

After the pressure is applied to the under-fill film RF, the base film BF is removed. The adhesive force between the solder resist 130 and the under-fill patterns UFP that is larger than the adhesive force between the solder resist 130 and the base film BF and the adhesive force between the base film BF and the under-fill patterns UFP allows the base film BF to be easily separated from the solder resist 130.

In the present exemplary embodiment, the under-fill patterns UFP are formed after the preliminary bumps PBP are formed on the solder resist 130, but the present disclosure is not limited thereto. For example, the under-fill patterns UFP may be first formed on the solder resist 130, and then the preliminary bumps PBP may also be formed.

Figure 5:
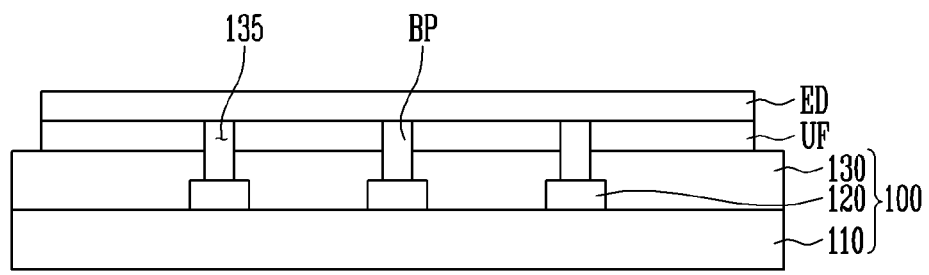

Referring to FIG. 5, after the under-fill patterns UFP are formed, an electronic device ED is disposed on the preliminary bumps PBP and the under-fill patterns UFP on the printed circuit board 100.

Then, the electronic device ED is mounted on the printed circuit board 100 by performing a reflow process.

The reflow process is a process of mounting the electronic device ED on the printed circuit board 100 by applying heat to the preliminary bumps PBP and the under-fill patterns UFP and/or pressure to the electronic device ED or the printed circuit board 100. As illustrated in FIG. 7, by the reflow process, the preliminary bumps PBP may be converted into bumps BP, and the bumps BP may be electrically connected the electronic device ED and the connection pads 120. Further, the under-fill patterns UFP and the preliminary bumps PBP may fill the gaps formed therebetween, so that a single-layered under-fill UF may be formed. That is, by the reflow process, the mounting of the electronic device ED and the forming of the under-fill UF may be simultaneously performed.

Further, the under-fill UF is not formed by injecting a resin including an under-fill material. Instead, the under-fill UF is formed by the reflow of the under-fill patterns UFP under heat and/or pressure. Accordingly, the under-fill UF may be prevented from being discharged to a peripheral area of the electronic device ED. Further, it is possible to prevent a surface of the printed circuit board 100 and an edge of the electronic device ED from being contaminated due to the discharge of the under-fill UF.

After the reflow process is performed, an external appearance of the printed circuit board 100, on which the electronic device ED is mounted, is examined. The examination of the external appearance determines whether the electronic device ED is mounted at an exact position on the printed circuit board 100.

The examination of the external appearance may be performed by an Automatic Optical Inspection (AOI). An AOI device can examine an external appearance of the printed circuit board 100. The AOI device may include an image sensor and a reading unit. The image sensor may obtain pattern information of a target, and the reading unit may compare the pattern information with reference data to detect a defect.

Hereinafter, the under-fill film RF will be described in more detail with reference to FIGS. 8 to 13.

FIGS. 10 to 13 are enlarged views of an area EA of FIG. 8.

Referring to FIGS. 8 to 13, the under-fill film RF may include a base film BF having a plurality of openings OP and the under-fill patterns UFP disposed in the openings OP. In one embodiment, the under-fill patterns UFP may be attached to the base film BF. In another embodiment, the under-fill patterns UFP may be separated from the base film BF and attached onto a surface of an adhered body. The adhered body may be the solder resist 130 illustrated in FIGS. 1 to 7.

An adhesive force between the under-fill patterns UFP and the adhered body may be larger than an adhesive force between the base film BF and the adhered body. Further, the adhesive force between the under-fill patterns UFP and the adhered body may be larger than an adhesive force between the base film BF and the under-fill patterns UFP if the under-fill patterns UFP are attached to the base film BF. Accordingly, in the under-fill film RF, the base film BF may be easily separated from the adhered body. Further, the under-fill patterns UFP may be separated from the base film BF and may be easily transferred to a surface of the to-be-adhered material, for example, the solder resist 130.

A cross-section of the openings OP parallel to a surface of the base film BF may have one of a circular shape and a rhombus shape.

Referring to FIGS. 10 through 13, the under-fill patterns UFP may include a body part UFP1 disposed in a center of the openings OP, and a plurality of connection parts UFP2 extended from sides of the body part UFP1 and connected to the base film BF. For example, the under-fill patterns UFP may include four connection parts UFP2. The connection parts UFP2 may have a shape with a decreasing width as being extended from the body part UFP1 to the base film BF. The body part UFP1 may have any shape between a circular shape (e.g., FIGS. 11 and 13) and a quadrangular shape (e.g., FIGS. 10 and 12).

Figure 10:
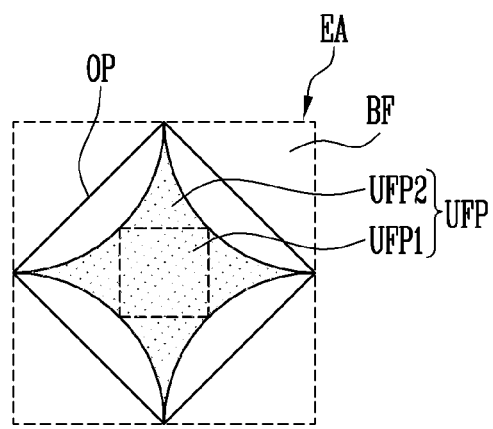
FIGS. 10 to 13 are enlarged views of an area EA of FIG. 8.
Figure 11:
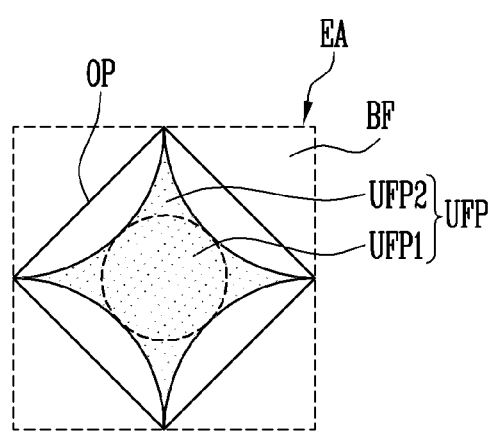

As illustrated in FIGS. 10 and 11, when the openings OP have a rhombus shape, the connection parts UFP2 may be connected to four apexes of the rhombus shape.

Figure 12:
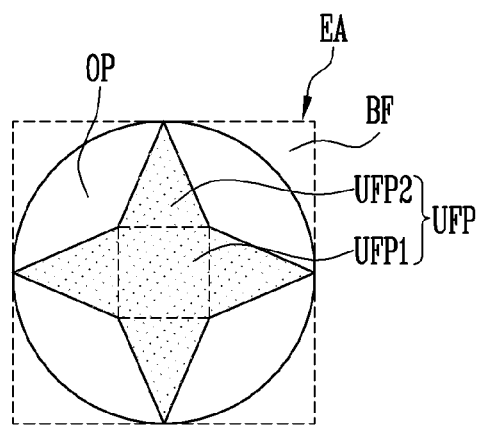
Figure 13:
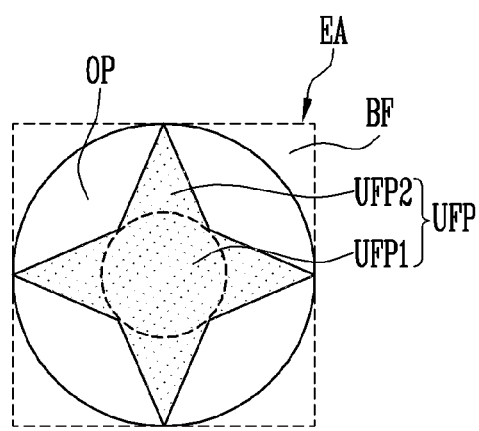

Further, as illustrated in FIGS. 12 and 13, when the openings OP have a circular shape, the connection parts UFP2 may be connected to four points on a circular arc. A line connecting two opposite points on the circular arc may be orthogonal to a line connecting the other two remaining points on the circular arc.

The above detailed description exemplifies the present disclosure. Further, the present disclosure simply represents and describes the exemplary embodiments. The present disclosure may be used in various other combinations, changes, and environments as described above, and may be changed or modified within the scope of the concept of the present disclosure, the scope equivalent to the present disclosure, and/or the scope of the technology or within the knowledge of an ordinary skilled person in the art. Accordingly, the detailed description of the present disclosure does not intend to limit the scope of the present disclosure to the disclosed exemplary embodiments. Further, it should be construed that the accompanying claims may include other exemplary embodiments.

What is claimed is:

1. An under-fill film, comprising:
   a base film having a plurality of openings spaced apart from each other; and
   a plurality of under-fill patterns disposed within the plurality of openings,
   wherein each of the under-fill patterns includes:
   a body part disposed in a center of an opening; and
   a plurality of connection parts extended from sides of the body part and connected to the base film.

2. The under-fill film of claim 1, wherein the plurality of connection parts have a shape with a decreasing width as being extended from the body part to the base film.

3. The under-fill film of claim 2, wherein a cross-section of an opening is parallel to a surface of the base film and has one of a circular shape and a rhombus shape.

4. The under-fill film of claim 3, wherein when the opening has a rhombus shape, the connection parts are connected to four apexes of the rhombus shape.

5. The under-fill film of claim 3, wherein when the opening has a circular shape, the connection parts are connected to four points on a circular arc, and a line connecting two opposite points on the circular arc is orthogonal to a line connecting the other two remaining points on the circular arc.

* * * * *